(12) United States Patent
Tang et al.

(10) Patent No.: US 7,392,447 B2
(45) Date of Patent: Jun. 24, 2008

(54) METHOD OF USING SCAN CHAINS AND BOUNDARY SCAN FOR POWER SAVING

(75) Inventors: Ying Yuan Tang, Panchiao (TW); Yung Sen Chen, Panchiao (TW); De Yu Kao, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 824 days.

(21) Appl. No.: 10/971,064

(22) Filed: Oct. 25, 2004

(65) Prior Publication Data

US 2006/0107074 A1    May 18, 2006

(51) Int. Cl.
*G01R 31/28* (2006.01)
(52) U.S. Cl. .................. 714/726; 714/727; 713/320; 713/300
(58) Field of Classification Search ............. 713/300, 713/320; 714/726–729
See application file for complete search history.

(56) References Cited

U.S. PATENT DOCUMENTS 7,000,163 B1 * 2/2006 Dirks et al. ................ 714/727

\* cited by examiner

*Primary Examiner*—Guy J Lamarre
(74) *Attorney, Agent, or Firm*—Muncy, Geissler, Olds & Lowe, PLLC

(57) ABSTRACT

The invention provides a method and circuitry to save power in a synchronous logic ASIC with low overhead. The scan chain(s) and boundary scan mechanism of the synchronous logic ASIC are used and modified for shifting out current states of internal memory devices of the synchronous logic ASIC to an external memory and for retaining the power-off blocks' primary output values to the memory devices of the boundary scan circuit, so the proposed gated power method is efficient and low overhead in the synchronous, flop-based, logic circuit design.

1 Claim, 5 Drawing Sheets

(a)

(b)

METHOD OF USING SCAN CHAINS AND BOUNDARY SCAN FOR POWER SAVING

FIELD OF THE INVENTION

The present invention relates to a method for reducing the leakage current in synchronous logic ASIC, and more particularly to a method by using technologies of Scan Chains and Boundary Scan (IEEE 1149.1) for power saving.

BACKGROUND OF THE INVENTION

Power saving is getting more and more important in recent integrated circuit design for all portable applications (for example, PDA, laptop computer, cellular phone ... etc.). The power consumption can be categorized into two main categories: dynamic power consumption (switching power, $P=CV^2f$), and static (leakage) power consumption.

For the dynamic power consumption, two techniques have been applied to reduce the power consumption by reducing C, V, and/or f (total capacitance, supplied voltage and/or operation frequency):

1. Improve processing technology, so both the supplied voltage and the circuit area/capacitance are reduced (reducing C and V).
2. Gated clock. Turn off the clock to reduce the switching frequency (reducing f).

For the static (leakage) power consumption, following methods have been used:

3. Devices/circuit improvement. In deep sub-micron and portable circuit design, the leakage current becomes a major factor in power consumption. Designers use high cut-in voltage ($V_T$) devices to reduce the leakage current and to improve static power consumption.
4. Gated power. Turn off the power for circuits not in use.

As to the method 3 stated above, a high $V_T$ might increase short circuit current, which may consume more dynamic power. Moreover, methods 1 and 3 must improve the process technologies, are expensive and progress slowly. Most of the fabless IC design houses could not afford the expenses and the developing time, so use whatever existing technologies to meet the power budget, methods 2 and 4 are fully controllable for the fabless design houses. Method 2 is considered as a better solution for the dynamic power saving, and method 4 is considered as an optimal solution for decreasing the leakage current.

For method 2, it's well known and has been widely used. There are CAD tools supporting the gated clock technology (for example, Synopsys' Power Compiler).

For a portable device more than 95% of the mission time is in the standby mode, so leakage current is one of the dominant factors for the power consumption. But the leakage current could not be blocked by gated clock (method 2). Gated power, method 4, is the best solution for portable devices' static power reduction. However, method 4 of gated power has not been widely used, because of the following two reasons:

1. Gated power needs extra memories, control circuits, and routing wires to save the contents of a power-off block. Too much hardware overheads are involved.
2. The power-off/power-on sequences are very trivial.

With two disadvantages stated above, gated power are widely known but not used often, so there are rooms for providing improvement.

OBJECT OF THE INVENTION

It is therefore an object of the present invention to provide a method and circuitry by utilizing the existing Scan Chains/Boundary Scan (EE.1149.1) technologies for gated power to reduce the hardware overhead for power saving in synchronous logic ASIC. A controller is embedded in a synchronous logic ASIC, and let org_s_mode, org_s_enable, org_bs_mode, org_bs_enable, power_off, clock and reset signals of the scan chains and boundary scan circuits to be inputted into the controller and generate a new set of control signals of s_mode, s_enable, bs_mode, bs_enable, pw_switch, scan_clock, bs_clock, mem_if to control the scan chains and boundary scan circuits such that:

a) during power-off of the synchronous logic ASIC:
   1) let clock(s) of the synchronous logic ASIC to be gated;
   2) preserve a set of primary outputs of the synchronous logic ASIC in memory devices of the boundary scan circuits, then switch the inputs of an external circuits from the primary outputs to the memory devices of the boundary scan circuit;
   3) shift out current states of internal memory devices of the synchronous logic ASIC to an external memory by the scan chains circuits;
   4) power off the synchronous logic ASIC;
b) during power-on of the synchronous logic ASIC:
   1) turn on the power and reset the power-offed circuitry;
   2) shift the stored value in the external memory through the scan chains circuit back to the internal memory devices of the synchronous logic ASIC by the scan chains circuits;
   3) switch the inputs of the external circuits from the memory devices of the boundary scan circuit to the primary outputs;
   4) turn on the gated clock.

DETAILED DESCRIPTION OF THE INVENTION

Figure 1:
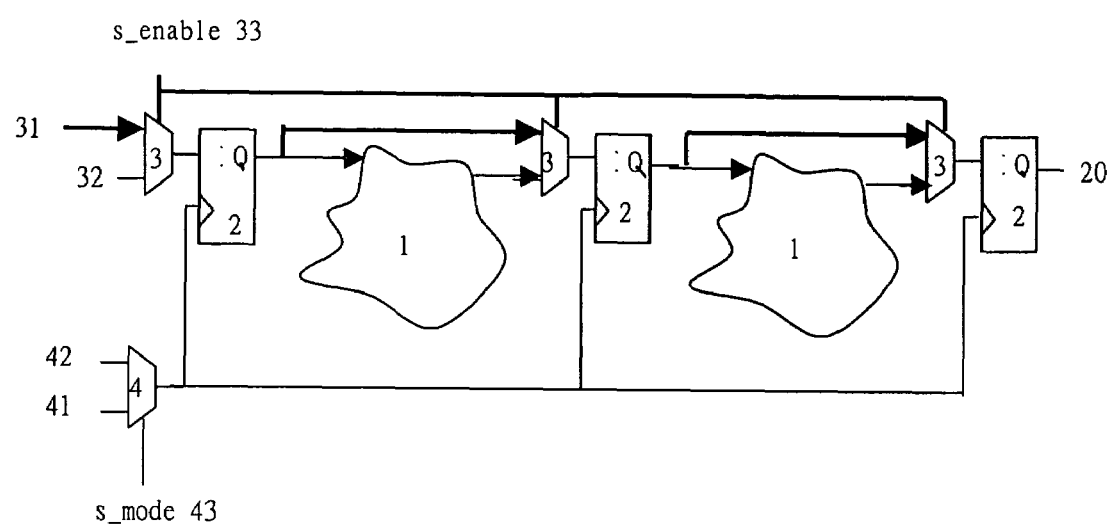
FIG. 1 shows schematically an example of Scan Chains.

Referring to the FIG. 1, a typical section of a production test Scan Chains is shown. In a synchronous logic ASIC, Scan Chains circuit will be added along with the main circuit. The main circuit comprises many combinational logic circuits 1 and many memory-type devices 2 (such as flip-flops, shift-registers). Scan Chain circuit comprises mutiplexer 3 and 4. Multiplxer 3 has two inputs "test 31" and "operation 32", while multiplexer 4 has two inputs "scan clock 41" and "main clock 42". When the control signals of s_enable 33 and s_mode 43 of the multiplexer 3 and 4 are pulled low, the "operation 32" and "main clock 42" will be inputted to the synchronous logic ASIC for normal operation. When the control signals of s_enable 33 and s_mode 43 of the multiplexer 3 and 4 are pulled high, the circuit goes into the scan mode for production test. The scan clock 41 will replace the main clock 42 to be inputted into the synchronous logic ASIC. The data of "test 31" will be shifted into the memory-type devices 2 (such as flip-flops, shift-registers) and bypass the combinational logic circuit 1, then shifted step by step through the memory-type devices 2 and out of the output port 20 for production testing of the synchronous logic ASIC.

Figure 2:
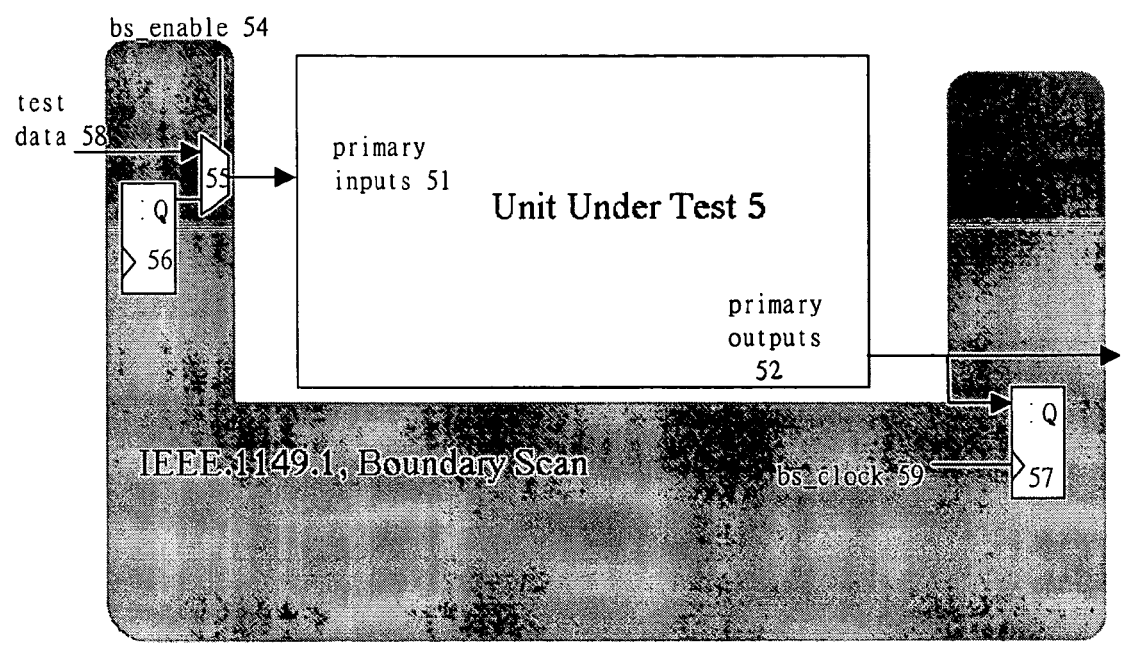
FIG. 2 shows schematically an example of Boundary-Scan (IEEE.1149.1) circuitry.

Referring to FIG. 2, a unit under test 5 is surrounded by IEEE.1149.1 of Boundary Scan mechanism (the shadow area) to preserve/observe the primary output signals 52. Using bs_clock 59 and bs_enable 54 signals, test data 58 will be inputted through the multiplexer 55 to the primary inputs 51, and primary output signals 52 of the unit under test 5 can be preserved by the memory devices 57 then shifted out through the boundary scan. The Boundary Scan mechanism is used to test the design of the unit under test 5.

Figure 3:
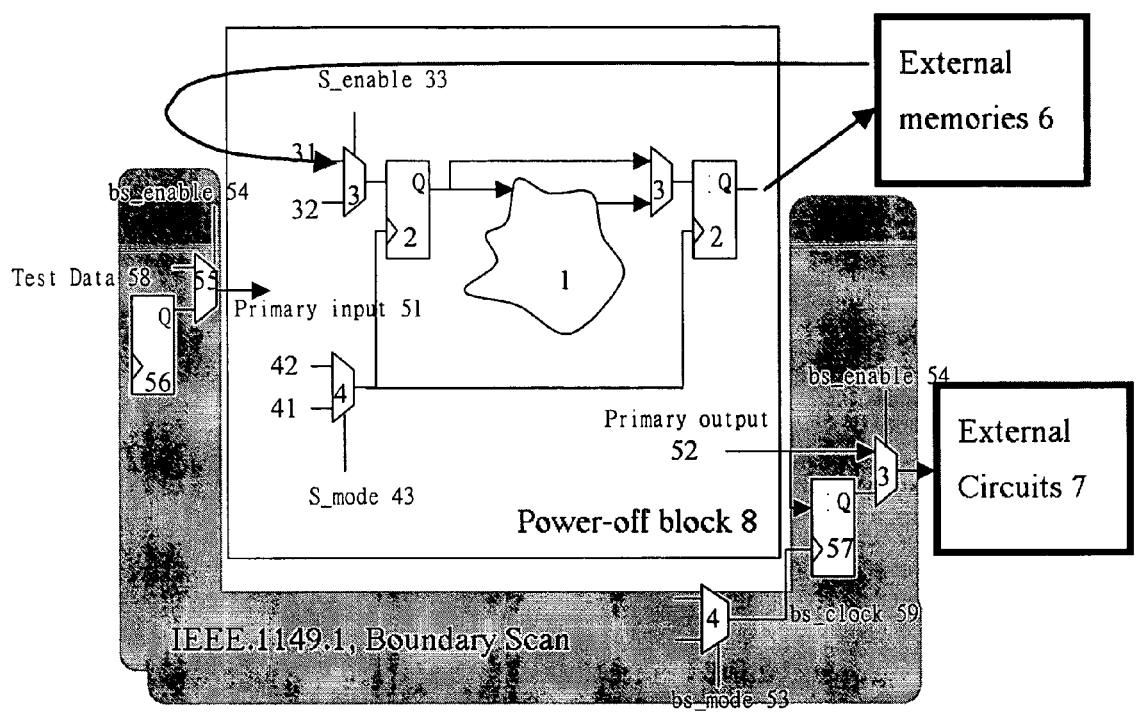
FIG. 3 shows schematically an example of combining Scan Chains and Boundary-Scan (IEEE.1149.1) in a synchronous logic ASIC.

FIG. 3 shows an embodiment of the present invention by combining the existing Scan Chain and the Boundary Scan (IEEE 1149.1) around a power-off block 8. The Scan Chain circuits and the Boundary Scan circuits are built-in circuits in integrated circuit for all portable applications. The present invention just utilizes the Scan Chain circuits and the Boundary Scan circuits for power saving. The present invention uses the Scan Chain circuits to save the contents of the memory devices of a power-off block 8 into an external memory 6 by letting the s_enable 33 and s_mode 43 of the multiplexer 3 and 4 to be pulled high, the power-off block 8 will then go into the scan mode. The present invention uses the Boundary Scan circuits to save the boundary conditions of the power-off block 8 into an external circuit 7.

Figure 4:
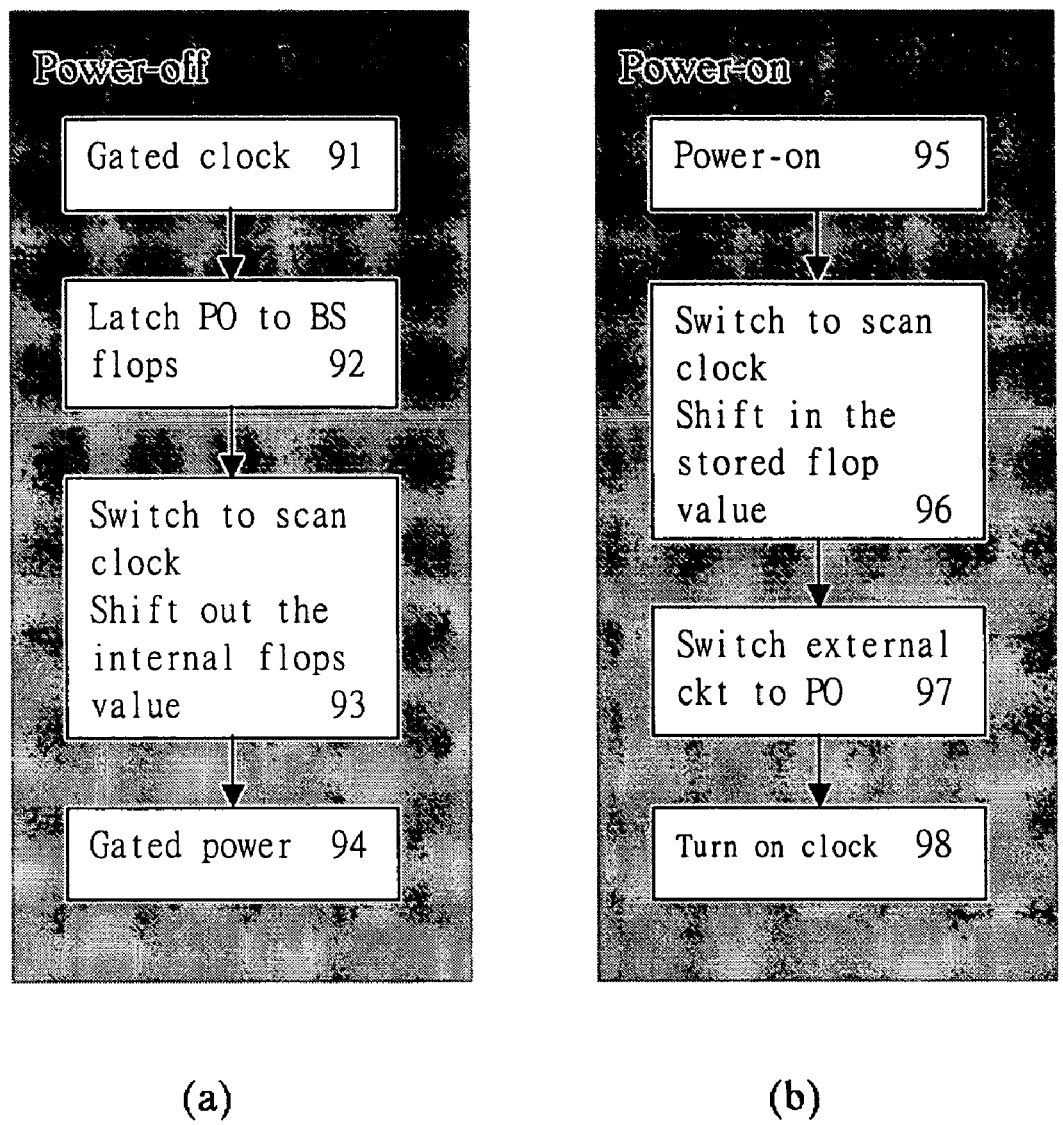
FIG. 4 shows schematically the flowchart of a proposed power-off/power-on sequence according to the present invention.

FIG. 4(a) shows a proposed power-off sequence according to the present invention.

The first step is to let the clock of the power-off block 8 to be gated (step 91); second, preserved the primary output 52 in the IEEE.1149.1 (Boundary Scan) flops 57, then switch the inputs of the external circuit 7 from the primary outputs 52 (from going-to-be-power-off block) to the boundary scan flops 57 (step 92); and shift out the current states of the internal flip-flops 2 through Scan Chain circuits to the external memory 6 (step 93). The final step is to power off the block 8 (step 94).

For restoring the power-offed circuitry back to the normal operation mode, FIG. 4(b) shows the power-on sequence. First, turn on the power and reset the power-offed block 8 (step 95); second, shift in the stored flops' value through the scan chains (step 96); third, switch the signals to the external circuit 7 from the boundary scan flops 57 back to the primary outputs 52 (step 97); final step, turn on the gated clock and the block 8 goes back to the normal operation (step 98).

Gated power method needs to perform the following two tasks: First, copy all the contents of memory devices in the power-off block 8 to an external memory 6 (another group of the flip-flops, RAM, or any other memory devices), so that the operation status could be restored after the power-on sequence. Second, the gated power method will make the primary outputs 52 of the power-off block 8 floating. Since those floating inputs are not allowed in an IC design, extra hardware to retain original signals is needed. Please refer to the FIG. 3 again.

Figure 5:
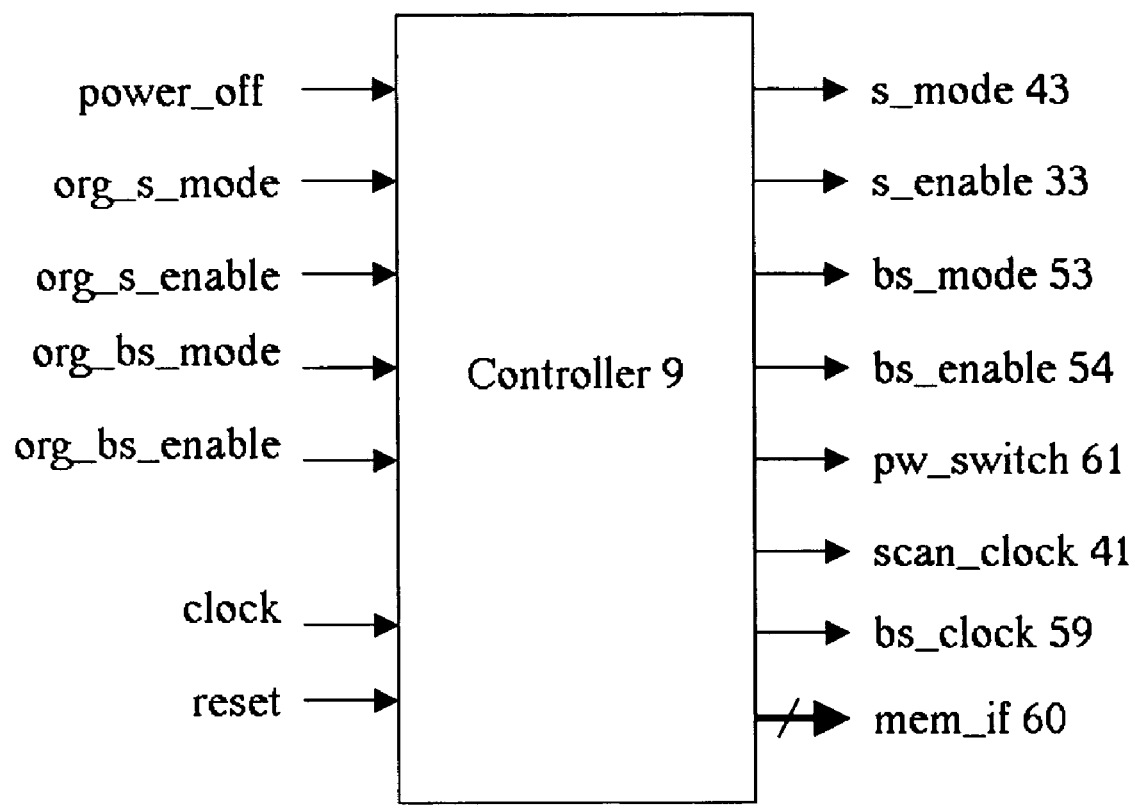
FIG. 5 shows schematically a block diagram of a controller circuitry according to the present invention.

To meet the two gated power tasks, FIG. 5 shows a controller design. The controller 9 will collect the orginal signals of Scan Chain and Boundary Scan and generate a new set of control signals to meet the power reduction application.

The orginal signals of Scan Chain and Boundary Scan are used for production test and design test respectively, but after the product passed the test, the orginal signals of Scan Chain and Boundary Scan are stick to high or stick to low and will not be used during the life cycle of the product. Therefore a new set of control signals based on the orginal signals of Scan Chain and Boundary Scan must be generated for power saving. The orginal signals of Scan Chain and Boundary Scan comprise org_s_mode, org_s_enable, org_bs_mode, org_bs_enable as shown in the left side of the controller in FIG. 5. Power_off, clock and reset signals are also arranged at the left side of the controller in FIG. 5 for instructing the controller 9.

The output pins, s_mode 43, switch the internal memory devices of the power-off block 8 among three operation modes: normal operation, low power gated clock mode, and the shift (in/out) mode. The s_mode 43 is a bus type, and needs to be re-designed whenever the Scan Chain's flop number is changed.

The s_enable 33 switches internal data path so the memory device 2 will take different input from "test 31" or "operation 32".

The bs_mode 53 decides the time to switch the latch clock for the boundary scan or the power saving mode of the primary output, and the bs_enable 54 will keeps as the same of the org_bs_enable, since this signal is not in use for the power saving, so the external circuits 7 will always get the output values from the power off block 8.

The pw_switch 61 controls the power switch.

The scan_clock 41 provides the scan in/out clock for the internal scan chain(s).

The bs_clock 59 is a clock controlled by bs_mode 53 to provide the clock for boundary scan flops 57.

The mem_if 60 is the memory control interface. Memory interface should be changed for different memories types.

An embedded CPU could replace the controller 9 described in the FIG. 5.

The presented method utilizes existing circuits/technologies to meet the power saving goal with very low gate count overhead.

The spirit and scope of the present invention depend only upon the following Claims, and are not limited by the above embodiments.

What is claimed is:

1. A method of using scan chains and boundary scan for power saving, in a synchronous logic ASIC having scan chains and boundary scan circuits wherein a controller is embedded for letting org_s_mode, org_s_enable, org_bs_mode, org_bs_enable, power_off, clock and reset signals of the scan chains and boundary scan circuits to be inputted into the controller and generate a new set of control signals of s_mode, s_enable, bs_mode, bs_enable, pw_switch, scan_clock, bs_clock, mem_if to control the scan chains and boundary scan circuits, the method comprising:

(a) during power-off of the synchronous logic ASIC:
   (1) letting a clock of the synchronous logic ASIC to be gated;
   (2) preserving a set of primary outputs of the synchronous logic ASIC in memory devices of the boundary scan circuits, then switching the inputs of an external circuits from the primary outputs to the memory devices of the boundary scan circuit;
   (3) shifting out current states of internal memory devices of the synchronous logic ASIC to an external memory by the scan chains circuits;
   (4) powering off the synchronous logic ASIC;
(b) during power-on of the synchronous logic ASIC:
   (1) turning on the power and resetting the power-offed circuitry;
   (2) shifting the stored value in the external memory through the scan chains circuit back to the internal memory devices by the scan chains circuits;
   (3) switching the inputs of the external circuits from the memory devices of the boundary scan circuit to the primary outputs;
   (4) turning on the gated clock.

* * * * *